(12) United States Patent
Chen et al.

(10) Patent No.: US 12,382,609 B2
(45) Date of Patent: Aug. 5, 2025

(54) NUCLEATION SURFACE TREATMENT FOR THERMAL COOLING

(71) Applicant: Quanta Computer Inc., Taoyuan (TW)

(72) Inventors: Chao-Jung Chen, Taoyuan (TW); Yu-Nien Huang, Taoyuan (TW); Herman Tan, Taoyuan (TW); Tien-Juei Chuang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 514 days.

(21) Appl. No.: 17/851,365

(22) Filed: Jun. 28, 2022

(65) Prior Publication Data

US 2023/0345671 A1    Oct. 26, 2023

Related U.S. Application Data (60) Provisional application No. 63/333,370, filed on Apr. 21, 2022.

(51) Int. Cl.
| | | |
|---|---|---|
| *H01L 23/427* | (2006.01) | |
| *F28F 13/18* | (2006.01) | |
| *H05K 7/20* | (2006.01) | |

(52) U.S. Cl.
CPC ....... *H05K 7/20318* (2013.01); *F28F 13/187* (2013.01); *H05K 7/20309* (2013.01); *H01L 23/427* (2013.01)

(58) Field of Classification Search
CPC .............. H01L 23/427; H05K 7/20809; H05K 7/20318; H05K 7/20309; F28F 13/187; G06F 1/20; G06F 2200/201
See application file for complete search history.

(56) References Cited

FOREIGN PATENT DOCUMENTS

| | | | |
|---|---|---|---|
| CN | 213120219 U | | 5/2021 |
| CN | 214426510 U | | 10/2021 |
| JP | 2008078564 A | * | 4/2008 |
| TW | M621971 U | | 1/2022 |

OTHER PUBLICATIONS

TW Office Action for Application No. 111138397, mailed Apr. 11, 2023, w/ First Office Action Summary.
TW Search Report for Application No. 111138397, mailed Apr. 11, 2023, w/ First Office Action.

* cited by examiner

*Primary Examiner* — Jay C Kim
*Assistant Examiner* — Joshua Scott Wyatt
(74) *Attorney, Agent, or Firm* — NIXON PEABODY LLP (57) ABSTRACT

A boiling plate including a first surface and a second surface. The first surface provided for contacting a heated component. The second surface is opposite the first surface, and the second surface provided for contacting a liquid medium. The second surface has multiple cone-shaped cavities including a first cone-shaped cavity and a second cone-shaped cavity. A distance between an axis of the first cone-shape cavity and an axis of the second cone-shaped cavity of the multiple cone-shaped cavities are separated by a minimum spacing of four times a radius of the first cone-shaped cavity or the second cone-shaped cavity.

12 Claims, 6 Drawing Sheets

NUCLEATION SURFACE TREATMENT FOR THERMAL COOLING

CROSS-REFERENCE TO RELATED APPLICATIONS

This application claims priority from and benefit of U.S. Provisional Patent Application Ser. No. 63/333,370, filed on Apr. 21, 2022, titled "High Effective Nucleation Surface Treatment," which is hereby incorporated by reference herein in its entirety.

FIELD OF THE INVENTION

The present invention relates generally to heat management in computing systems, and more specifically, to a liquid cooling cold plate surface design for improved cooling in computing systems.

BACKGROUND OF THE INVENTION

Computing systems typically have electronic components housed in a chassis. Examples of computing systems include desktop computers, blade servers, rack-mount servers, etc. Computing systems generally generate heat in typical operation, therefore, heat management is employed. Heat management can be localized to some components and/or globalized to air surrounding all components within the computing system. Localized heat management is focused on specific hardware components of computing systems that generate heat, for example, processors, mechanical disks, power supplies, etc. Globalized heat management involves reducing ambient temperature within the chassis, for example, by expelling warmer air from within the chassis to the environment and drawing in cooler air from the environment into the chassis.

The goal of heat management is to cool electronic components of computing systems so that these components do not operate outside their respective ratings and/or do not become damaged due to excessive heating. Cooling electronic components allows computing systems to operate at peak efficiency. Heat sinks, fans, liquid cooling systems with heat exchangers, etc., are used in cooling specific electronic components. In liquid cooling systems, boiling heat transfer relies on bubble formation for effective heat transfer. Conventional cold plates have nucleation sites that may not be activated at lower boiling temperatures. Thus, heat dissipation can be poor. The present disclosure provides solutions that at least improve bubble formation in nucleation sites on cold plates.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a boiling plate is provided. The boiling plate includes a first surface for contacting a heated component and a second surface opposite the first surface. The second surface is for contacting a liquid medium. The second surface has multiple cone-shaped cavities including a first cone-shaped cavity and a second cone-shaped cavity. A first axis of the first cone-shape cavity and a second axis of the second cone-shaped cavity are separated by a minimum spacing of four times a radius of the first cone-shaped cavity or of the second cone-shaped cavity.

In an implementation, the boiling plate is a metal plate. In an implementation, a thickness of the boiling plate is between 0.5 millimeter (mm) and 5 mm. In an implementation, the radius of the first cone-shaped cavity or of the second cone-shaped cavity is about 0.1 mm. In an implementation, the multiple cone-shaped cavities include a third cone-shaped cavity having a radius that is greater than the radius of the first cone-shaped cavity or of the second cone-shaped cavity. In an implementation, the multiple cone-shaped cavities are arranged such that the first cone-shaped cavity and the second cone-shaped cavity are in a first region having a first cavity density, the third cone-shaped cavity is in a second region having a second cavity density, and the first cavity density being greater than the second cavity density. In an implementation, the radius of the first cone-shaped cavity or of the second cone-shaped cavity is determined based on $$r = \xi \frac{\sin^2\theta}{1+\cos\theta}\left(\frac{2\sigma T_{sat} v_{lv}}{h_{lv}} \frac{k_l}{q''}\right)^{1/2},$$

where $\xi$ is a deformation factor, $T_{sat}$ is a saturation temperature, $v_{lv}$ is a specific volume difference between vapor and the liquid medium, $h_{lv}$ is latent heat, $k_l$ is conductivity of the liquid medium, and $q''$ is surface heat flux that requires cooling. In an implementation, the multiple cone-shaped cavities are arranged in a honeycomb pattern. In an implementation, the multiple cone-shaped cavities include a third cone-shaped cavity having a same radius as the first cone-shaped cavity and the second cone-shaped cavity. The lines connecting axes of the first cone-shaped cavity, the second cone-shaped cavity, and the third cone-shaped cavity form an equilateral triangle.

According to certain aspects of the present disclosure, a computing system is provided. The computing system includes a circuit board, an electronic component installed on the circuit board, and a boiling plate having a first surface and a second surface. The boiling plate is in contact with the electronic component at the first surface. The second surface is in contact with a liquid medium. The second surface has multiple cone-shaped cavities including a first cone-shaped cavity and a second cone-shaped cavity. A first axis of the first cone-shaped cavity and a second axis of the second cone-shaped cavity are separated by a minimum spacing being four times larger than a first radius of the first cone-shaped cavity or a second radius of the second cone-shaped cavity.

In an implementation, the boiling plate consists of a metal material. In an implementation, a thickness of the boiling plate is between 0.5 mm and 5 mm. In an implementation, the first radius or the radius is about 0.1 mm. In an implementation, the multiple cone-shaped cavities include a third cone-shaped cavity having a third radius that is greater than the first radius or the second radius. In an implementation, the multiple cone-shaped cavities are arranged such that the first cone-shaped cavity and the second cone-shaped cavity are in a first region having a first cavity density, the third cone-shaped cavity is in a second region having a second cavity density, and the first cavity density being greater than the second cavity density. In an implementation, the radius of the first cone-shaped cavity or the second cone-shaped cavity is determined based on $$r = \xi \frac{\sin^2\theta}{1+\cos\theta}\left(\frac{2\sigma T_{sat} v_{lv}}{h_{lv}} \frac{k_l}{q''}\right)^{1/2},$$

where $\xi$ is a deformation factor, $T_{sat}$ is a saturation temperature, $v_{lv}$ is a specific volume difference between vapor and the liquid medium, $h_{lv}$ is latent heat, $k_l$ is conductivity of the liquid medium, and $q''$ is surface heat flux that requires cooling. In an implementation, the multiple cone-shaped cavities are arranged in a honeycomb pattern. In an implementation, the multiple cone-shaped cavities include a third cone-shaped cavity having a same radius as the first cone-shaped cavity and the second cone-shaped cavity. The lines connecting axes of the first cone-shaped cavity, the second cone-shaped cavity, and the third cone-shaped cavity form an equilateral triangle. In an implementation, the computing system further includes a heat exchanger coupled to the boiling plate via at least two conduits. In an implementation, the heat exchanger includes a condenser or a radiator.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

With scaling and smaller electronic components integrated in computing systems, a problem encountered in cooling electronic components today is improving heat transfer rates over smaller areas and/or volumetric footprints of the electronic components. Conventional air cooling typically require larger space for heatsinks and/or fins on the heatsinks. Liquid cooling provides one way of alleviating these drawbacks of conventional air cooling. Liquid cooling typically involves placing a cold plate (or a boiling plate) in contact with an electronic component. The cold plate in contact with the electronic component facilitates heat transfer from the electronic component to the cold plate, and from the cold plate to a liquid cooling medium. The cold plate generally requires channels to facilitate the flow of the liquid cooling medium through the cold plate. The liquid cooling medium typically has a higher specific heat capacity than air.

One avenue of exploration for liquid cooling is employing boiling heat transfer technology to remove large amounts of heat from a hot body (e.g., a processor) via transport of latent heat with a phase-change. With large latent heat during phase change, boiling heat transfer can easily absorb a huge amount of heat on a small area. Thus, boiling heat transfer is expected to generate state-of-the-art cooling solutions for the future electronics. Boiling heat transfer can be enhanced by increasing active nucleation site density. Boiling plate surfaces are typically treated with coatings, dimples, grooves, etc., to enhance boiling heat transfer. The treatments aim to increase nucleation sites that make bubble formation easier.

However, not every nucleation site created by treatment is activated during boiling. It is common to observe that only few bubbles form when boiling starts. Bubble formation will only take place at higher surface temperatures and higher power consumption. That is, most nucleation sites are not activated prior to achieving higher temperature or power consumption, thus rendering surface treatment inefficient in promoting boiling heat transfer. Thus, embodiments of the present disclosure provide systems and methods for surface treatment capable of controlling onset boiling and starting bubble formation as early as possible when boiling starts to ensure efficient heat transfer. Embodiments of the present disclosure provide surface treatment with multiple cone shaped cavities to control boiling heat transfer.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
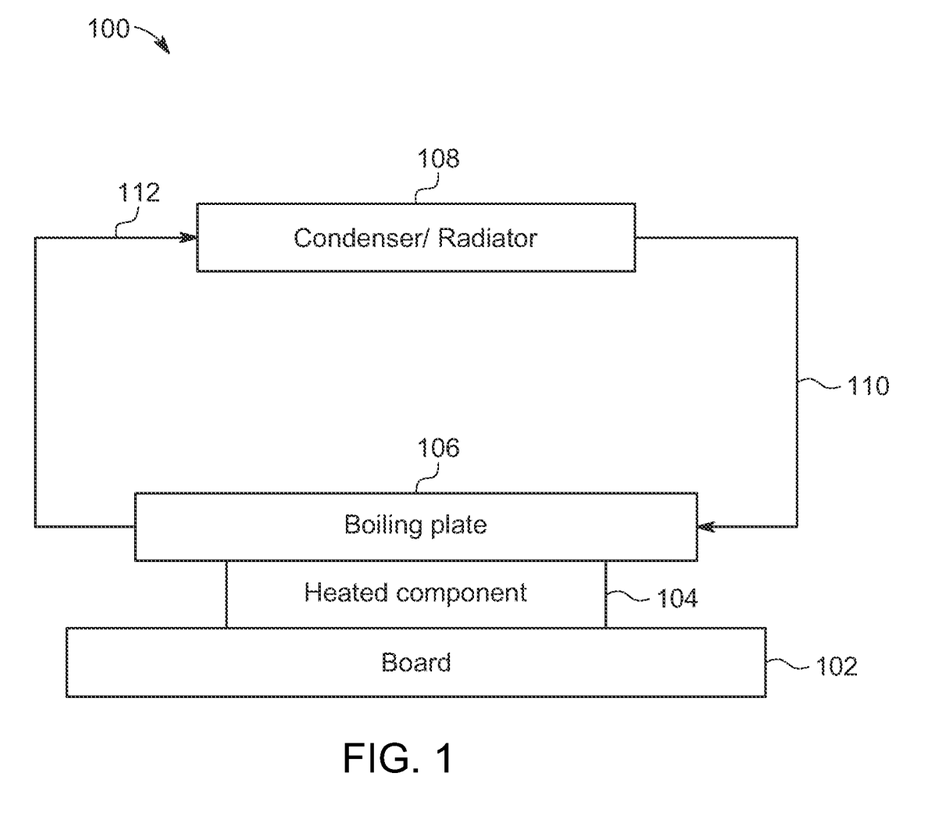
FIG. 1 shows a block diagram of a liquid cooling system, according to certain aspects of the present disclosure.

Referring to FIG. 1, a block diagram of a system 100 including liquid cooling is provided, according to certain aspects of the present disclosure. The system 100 includes a board 102, a heated component 104, a boiling plate 106, and a heat exchanger 108. The board 102 is an electronic board, for example, a circuit board or a printed circuit board. Examples of the board 102 include a motherboard or any other type of circuit board that can receive electronic components. The heated component 104 is an electronic device. Examples of electronic devices include a chip, one or more on-chip transformers, one or more processors, one or more controllers, etc. The heated component 104 can be included in a package that can be installed in a socket on the board 102.

The boiling plate 106 makes contact with the heated component 104. The boiling plate 106 is parallel to the board 102. The boiling plate 106 includes a first surface that is in contact with the heated component 104 and a second surface that is in contact with a liquid medium. The liquid medium flows from the heat exchanger 108 to the boiling plate 106 through an inlet pipe 110 and flows from the boiling plate 106 back to the heat exchanger 108 through an outlet pipe 112. The outlet pipe 112 can contain a small amount of vapor, and the temperature of the liquid/vapor in the outlet pipe 112 is generally equal to or higher than the temperature of the liquid in inlet pipe 110. The outlet pipe 112 extracts warm liquid from the boiling plate 106 to the heat exchanger 108. The inlet pipe 110 and the outlet pipe 112 are examples of conduits for directing flow of the liquid medium. The second surface of the boiling plate 106 in contact with the liquid medium has a surface treatment for improving heat transfer from the boiling plate 106 to the liquid medium.

The boiling plate 106 can be made of one or more metals, one or more metal alloys, graphite, and the like. For example, the metal can be aluminum, copper, silver, etc. In some implementations, the boiling plate 106 is a metal alloy (e.g., a eutectic alloy of silver and copper). More general, the boiling plate 106 can be made of any high thermal conductivity material, such as a material with a thermal conductivity of about 300 Watts per meter-kelvin (W/mK). The boiling plate 106 can be about 0.5 mm to 5 mm thick. The thickness of the boiling plate 106 can be defined as the separation of the first surface of the boiling plate 106 and the second surface of the boiling plate 106. The thickness of the boiling plate 106 can be designed based on the type of liquid medium being used.

Figure 2:
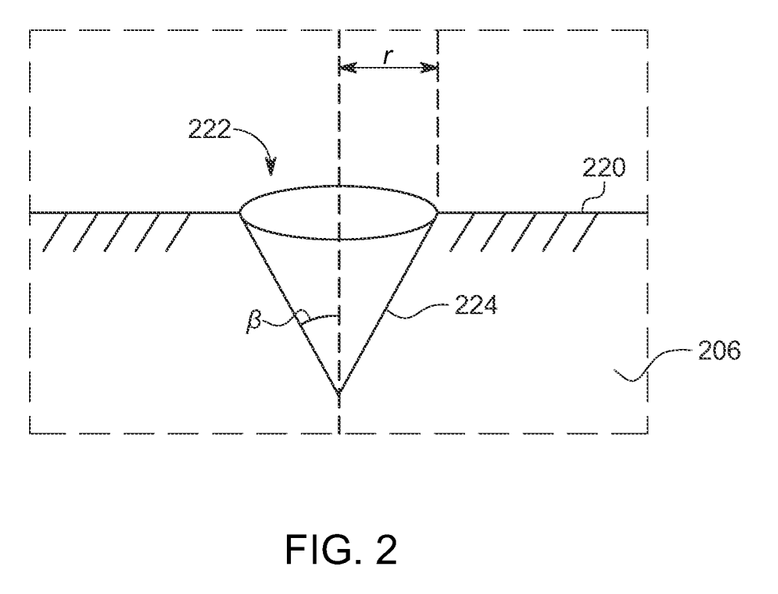
FIG. 2 shows a perspective view of cone-shaped cavity dimensions, according to certain aspects of the present disclosure.

Referring to FIG. 2, a zoomed in portion showing a cone-shaped cavity 222 on a surface 220 of a boiling plate 206 is provided, according to certain aspects of the present disclosure. The cone-shaped cavity 222 is an example surface treatment on the boiling plate 206. Multiple cone-shaped cavities (e.g., the cone-shaped cavity 222) are provided on the surface 220 to control boiling heat transfer. These cone-shaped cavities are purposed for nucleation sites when phase change is taking effect. Example parameters of the cone-shaped cavity 222 can include a half-cone angle $\beta$ and a radius r of the cone-shaped cavity 222. In some implementations, the radius r of the cone-shaped cavity 222 is less than about 0.1 mm. An angled sidewall 224 defines the shape of the cone-shaped cavity 222. The parameters of the cone-shaped cavity 222 can determine properties of liquid flow along the surface 220 of the boiling plate 206.

Figure 3:
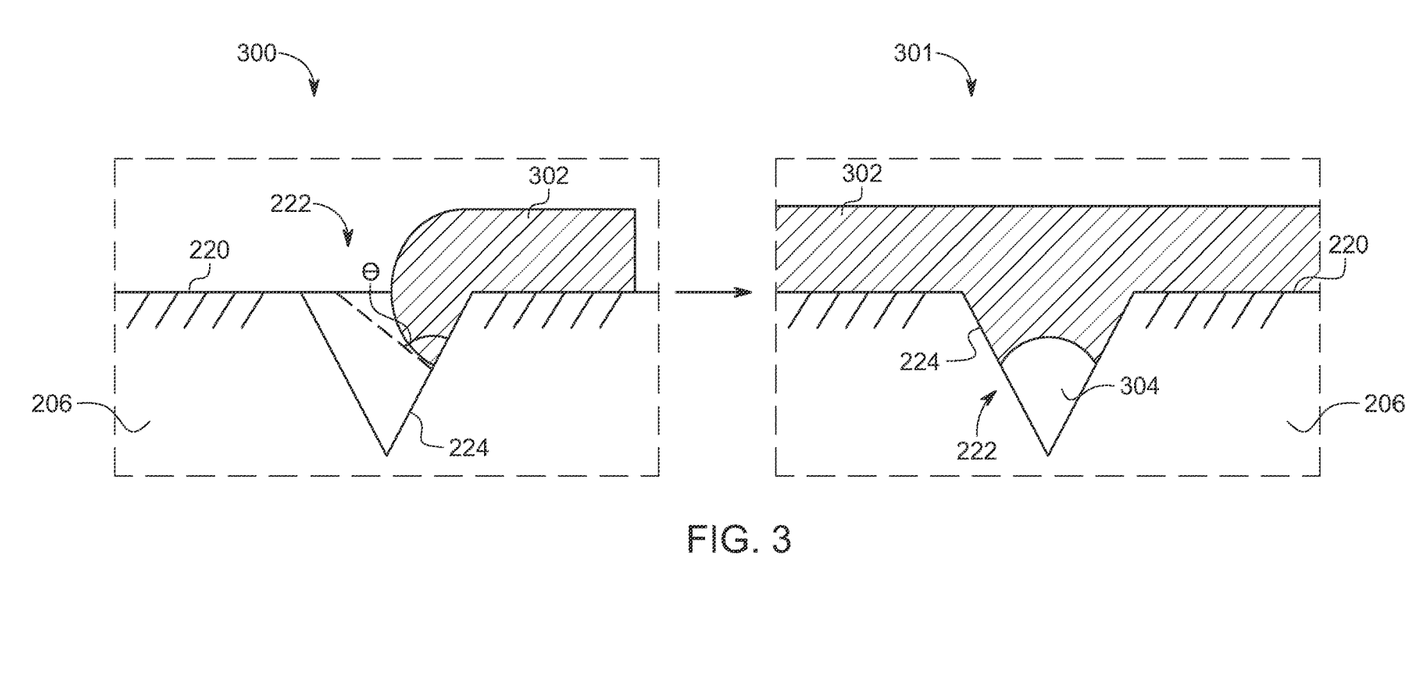
FIG. 3 shows cross-section views of liquid flowing through a cavity, according to certain aspects of the present disclosure.

Referring to FIG. 3, liquid 302 flowing through the cone-shaped cavity 222 is illustrated, according to some implementations of the present disclosure. The liquid 302 is shown in a first position 300 and in a second position 301. Referring to the first position, a liquid-solid contact angle $\theta$ forms as the liquid 302 begins to at least partially fill or traverse the cone-shaped cavity 222. The liquid-solid contact angle $\theta$ depends on the type of liquid and type of material used to form the boiling plate 206. The liquid-solid contact angle $\theta$ can control whether a void is present in the cone-shaped cavity 222. In some implementations, the half-cone angle $\beta$ is less than half the liquid-solid contact angle $\theta$ to guarantee a void (e.g., a first void 304) is present while the liquid 302 flows into the cone-shaped cavity 222 due to liquid surface tension. The first void 304 serves as a nucleation site when boiling of the liquid 302 starts on the surface 220 of the boiling plate 206.

Figure 4:
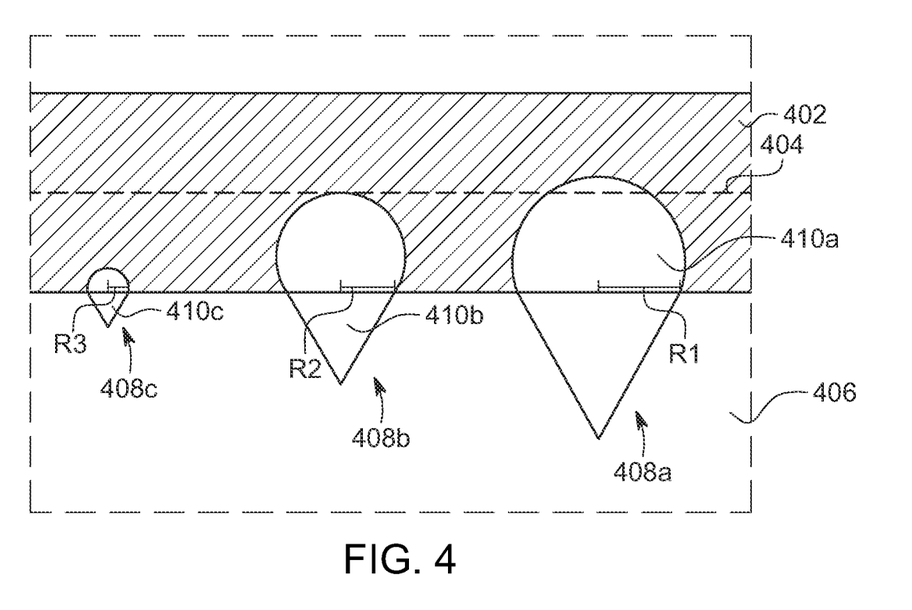
FIG. 4 shows a cross-section view of liquid flow as a function of cavity size, according to certain aspects of the present disclosure.

Size of the cone-shaped cavity 222 can determine properties or characteristics of the nucleation site. For example, FIG. 4 illustrates liquid 402 flow across different sized cone-shaped cavities. A boiling plate 406 has a first cone-shaped cavity 408a, a second cone-shaped cavity 408b, and a third cone-shaped cavity 408c. The first, second, and third cone-shaped cavities 408a, 408b, and 408c are all different sizes with the first cone-shaped cavity 408a having the largest size, and the third cone-shaped cavity 408c having the smallest size. As shown in FIG. 4, a radius r1 of the first cone-shaped cavity 408a is larger than a radius r2 of the second cone-shaped cavity 408b, and the radius r2 of the second cone-shaped cavity 408b is larger than the radius r3 of the third cone-shaped cavity 408c.

At nucleation sites, vapors form and expand. Larger sized cone-shaped cavities can lead to larger vapor bubbles being formed. For example, the first cone-shaped cavity 408a can form a first vapor bubble 410a which is larger than a second vapor bubble 410b in the second cone-shaped cavity 408b. Similarly, the second vapor bubble 410b is larger than a third vapor bubble 410c in the third cone-shaped cavity 408c. A larger sized cone-shaped cavity can lead to vapor bubbles being cooled by the liquid 402 outside the thermal boundary 404 before the vapor bubbles depart from the larger sized cone-shaped cavity. On the other hand, a smaller sized cone-shaped cavity can lead to smaller-sized bubbles that need extra energy to expand against the liquid 402. The size of the cone-shaped cavities can be optimized to the size of the second cone-shaped cavity 408b to achieve a more efficient heat transfer. Both the size of the first cone-shaped cavity 408a and the third cone-shaped cavity 408c can cause vapor departure delay from their respective nucleation sites, thus leading to inefficient heat transfer. The thermal boundary 404 (shown in a dashed line) is provided in FIG. 4 to indicate that the height of the second vapor bubble 410b is optimized when compared to the first vapor bubble 410a (too large) and the third vapor bubble 410c (too small).

In some implementations, cone-shaped cavities can be sized according to (i) the surface heat flux that should be cooled and (ii) a liquid medium's utilized fluid characteristics. In some implementations, equation 1 can be used for the sizing of the radius r of cone-shaped cavities.

$$r = \xi \frac{\sin^2\theta}{1+\cos\theta}\left(\frac{2\sigma T_{sat} v_{lv}}{h_{lv}} \frac{k_l}{q''}\right)^{1/2} \quad \text{(Equation 1)}$$

In equation 1, $\xi$ is a deformation factor, $T_{sat}$ is a saturation temperature, $v_{lv}$ is a specific volume difference of vapor and the liquid medium, $h_{lv}$ is latent heat, $k_l$ is conductivity of the liquid medium, and $q''$ is surface heat flux that needs to be cooled. Typically, depths of the cone-shaped cavities are not much greater than the radius r of the cone-shaped cavities.

Figure 5:
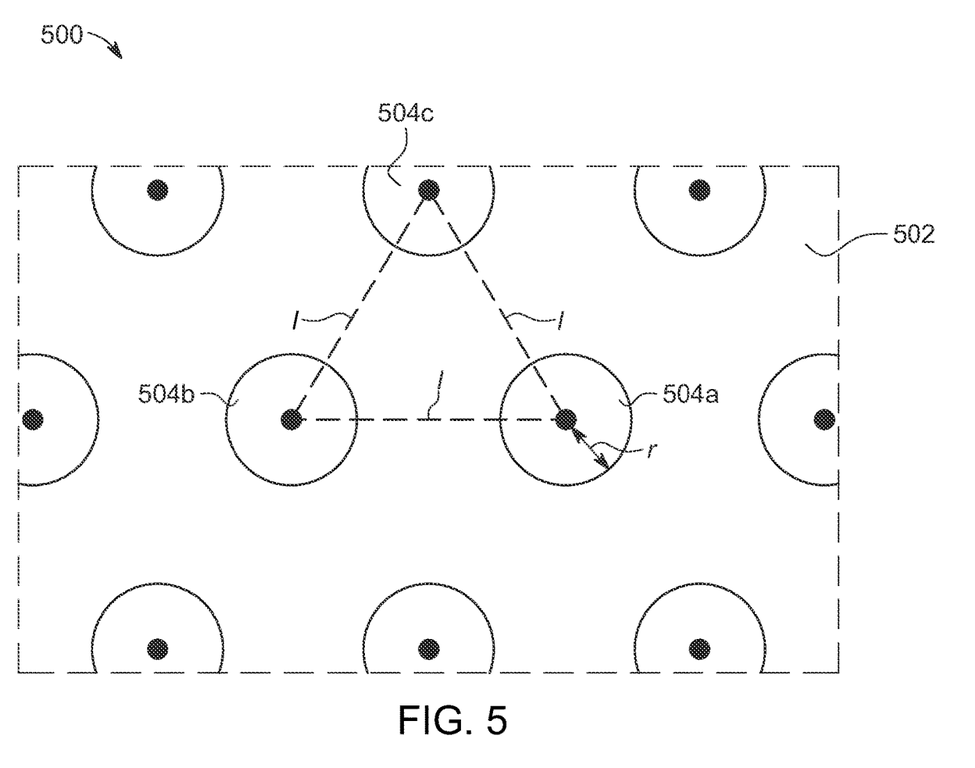
FIG. 5 shows a top view of an arrangement of cavities on a plate, according to certain aspects of the present disclosure.

Cone-shaped cavities can be provisioned on boiling plate surfaces in different manners. For example, FIG. 5 illustrates a honeycomb pattern arrangement of multiple cone-shaped cavities (e.g., a first cone-shaped cavity 504a, a second cone-shaped cavity 504b, and a third cone-shaped cavity 504c) on a surface 502 of a boiling plate 500, according to certain aspects of the present disclosure. The black dots represent centers of the cone-shaped cavities and would represent locations of the axes of the cone-shaped cavities, and the dashed lines represent a nearest distance l between cavities. That is, the distance between cavities, along the surface of the cavities, is measured between the axes of the cone-shaped cavities. In some implementations, the nearest distance l is about 4 times the cavity size (e.g., four times the radius r). This distance is provided as an example, but can be adjusted based on design targets to achieve a desired heat transfer profile. For example, a larger distance between cavities can sacrifice quality of heat transfer at the boiling start point, while a shorter distance can lead to adjacent bubbles accumulating and causing temperature spikes or burn outs due to sudden liquid absence on the surface 502.

In the honeycomb pattern arrangement of FIG. 5, the first cone-shaped cavity 504a, the second cone-shaped cavity 504b, and the third cone-shaped cavity 504c can have the same radius r. That is, all three cone-shaped cavities are of the same size. Thus, if the three cone-shaped cavities are of the same size and are equidistant from each other, an equilateral triangle can be drawn as in FIG. 5 with sides of length l. The arrangement in FIG. 5 is merely shown as an example and the distance between cavities need not be the same.

Figure 6:
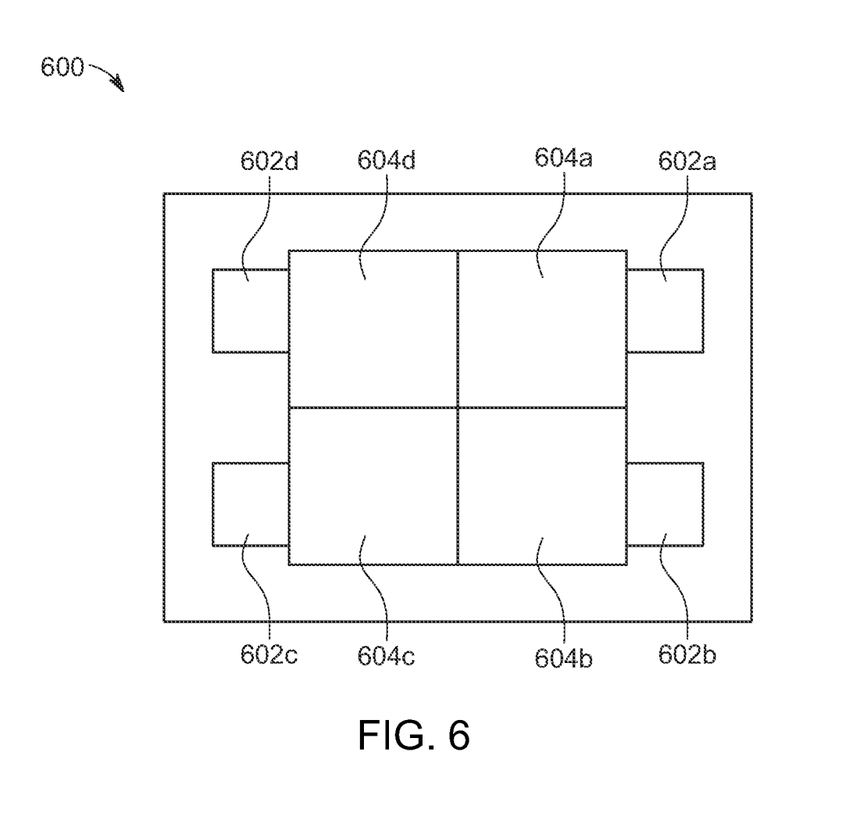
FIG. 6 shows a top view of an electronic component with non-uniform power distribution, according to certain aspects of the present disclosure.

In some implementations, different areas of the boiling plate 500 can have different separation between cavities. That is, different areas of the boiling plate 500 can have a different cavity density. For example, FIG. 6 illustrates an electronic component 600 with different power distribution areas (e.g., a first set of areas 604a, 604b, 604c, and 604d and a second set of areas 602a, 602b, 602c, and 602d). The first set of areas 604a, 604b, 604c, and 604d can generate more heat compared to the second set of areas 602a, 602b, 602c, and 602d. The electronic component 600 can be a processor where different areas of the processor generate heat in a non-uniform manner.

A boiling plate for use with the electronic component 600 can be designed to match power distribution. That is, the surface of the boiling plate can have cone-shaped cavities with different sizes and/or cone-shaped cavities separated by different distances to account for the non-uniform heat generation expected from the electronic component 600. In the example where the first set of areas 604a, 604b, 604c, and 604d generates more heat, the first set of areas 604a, 604b, 604c, and 604d will have a higher heat flux compared to the second set of areas 602a, 602b, 602c, and 602d. Thus, the boiling plate design interfacing with the first set of areas 604a, 604b, 604c, and 604d can have smaller cavities closely spaced together, and the second set of areas 602a, 602b, 602c, and 602d can have larger cavities spaced further apart. This design decision can ensure the boiling plate has efficient active nucleation sites and optimum heat transfer.

Therefore, at the interface between one of the first set of areas 604a, 604b, 604c, and 604d and one of the second set of areas 602a, 602b, 602c, and 602d, interface considerations can be taken into account for cavity size and spacing. For example, smaller sized cavities will be next to larger sized cavities and vice versa. Furthermore, if each area has a specific spacing between cavities in its respective area, then the spacing may be different when a larger sized cavity is placed next to a smaller sized cavity. That is, a first distance between two adjacent larger sized cavities and a second distance between two adjacent smaller sized cavities can be different from a third distance between a larger sized cavity and a smaller sized cavity. The first distance, the second distance, and the third distance can all be different values.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
   a circuit board;
   an electronic component installed on the circuit board and producing heat;
   a heat exchanger having a liquid medium; and
   a boiling plate having a first surface and a second surface, the boiling plate being in flow communication with the heat exchanger, the liquid medium flowing from the heat exchanger to the boiling plate in a cool state at a first temperature, the liquid medium flowing from the boiling plate to the heat exchanger in a warm state at a second temperature, the second temperature being greater than the first temperature, at least a portion of the liquid medium exhibiting a phase change from a liquid phase to a gas phase in response to the heat;

wherein the boiling plate is in contact with the electronic component at the first surface, the second surface being in contact with the liquid medium, the second surface having multiple cone-shaped cavities including a first cone-shaped cavity and a second cone-shaped cavity for controlling boiling heat transfer in nucleation sites when the phase change occurs in the liquid medium from the liquid phase to the gas phase, the first cone-shaped cavity being directly adjacent to the second cone-shaped cavity, a distance between a first axis of the first cone-shaped cavity and a second axis of the second cone-shaped cavity of the multiple cone-shaped cavities being separated by a minimum spacing, the minimum spacing being four times larger than a first radius of the first cone-shaped cavity or a second radius of the second cone-shaped cavity, the first radius and the second radius being a largest respective radius of the first cone-shaped cavity and the second cone-shaped cavity, the multiple cone-shaped cavities improving heat transfer from the boiling plate to the liquid medium.

2. The computing system of claim 1, wherein the boiling plate consists of a metal material.

3. The computing system of claim 1, wherein a thickness of the boiling plate is between 0.5 millimeter (mm) and 5 mm.

4. The computing system of claim 1, wherein the first radius or the second radius is about 0.1 mm.

5. The computing system of claim 1, wherein the multiple cone-shaped cavities include a third cone-shaped cavity having a third radius that is greater than the first radius or the second radius.

6. The computing system of claim 5, wherein the multiple cone-shaped cavities are arranged such that the first cone-shaped cavity and the second cone-shaped cavity are in a first region having a first cavity density, the third cone-shaped cavity being in a second region having a second cavity density, and the first cavity density being greater than the second cavity density.

7. The computing system of claim 1, wherein the radius of the first cone-shaped cavity or the second cone-shaped cavity is determined based on $$r = \xi \frac{\sin^2\theta}{1+\cos\theta}\left(\frac{2\sigma T_{sat}v_{lv}}{h_{lv}}\frac{k_l}{q''}\right)^{1/2}$$

where $\xi$ is a deformation factor, $T_{sat}$ is a saturation temperature, $v_{lv}$ is a specific volume difference between vapor and the liquid medium, $h_{lv}$ is latent heat, $k_l$ is conductivity of the liquid medium, and q" is surface heat flux that requires cooling.

8. The computing system of claim 1, wherein the multiple cone-shaped cavities are arranged in a honeycomb pattern.

9. The computing system of claim 8, wherein the multiple cone-shaped cavities include a third cone-shaped cavity having a same radius as the first cone-shaped cavity and the second cone-shaped cavity, and wherein lines connecting axes of the first cone-shaped cavity, the second cone-shaped cavity, and the third cone-shaped cavity form an equilateral triangle.

10. The computing system of claim 1, wherein the heat exchanger is coupled to the boiling plate via at least two conduits.

11. The computing system of claim 10, wherein the heat exchanger includes a condenser or a radiator.

12. A computing system comprising:
a circuit board;
an electronic component installed on the circuit board and producing heat;
a heat exchanger having a liquid medium; and
a boiling plate having a first surface and a second surface, the boiling plate being in flow communication with the heat exchanger;
wherein the boiling plate is in contact with the electronic component at the first surface, the second surface being in contact with the liquid medium, the second surface having multiple cone-shaped cavities including a first cone-shaped cavity and a second cone-shaped cavity, the first cone-shaped cavity being directly adjacent to the second cone-shaped cavity, a distance between a first axis of the first cone-shaped cavity and a second axis of the second cone-shaped cavity of the multiple cone-shaped cavities being separated by a minimum spacing, the minimum spacing being four times larger than a first radius of the first cone-shaped cavity or a second radius of the second cone-shaped cavity, the first radius and the second radius being a largest respective radius of the first cone-shaped cavity and the second cone-shaped cavity, the multiple cone-shaped cavities improving heat transfer from the boiling plate to the liquid medium;
wherein the radius of the first cone-shaped cavity or the second cone-shaped cavity is determined based on $$r = \xi \frac{\sin^2\theta}{1+\cos\theta}\left(\frac{2\sigma T_{sat}v_{lv}}{h_{lv}}\frac{k_l}{q''}\right)^{1/2}$$

where $\xi$ is a deformation factor, $T_{sat}$ is a saturation temperature, $v_{lv}$ is a specific volume difference between vapor and the liquid medium, $h_{lv}$ is latent heat, $k_l$ is conductivity of the liquid medium, and q" is surface heat flux that requires cooling.

\* \* \* \* \*